United States Patent

Pham

[11] Patent Number: 5,871,813
[45] Date of Patent: *Feb. 16, 1999

[54] APPARATUS AND METHOD FOR CONTROLLING PROCESS CHAMBER PRESSURE

[75] Inventor: Thanh Pham, San Jose, Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 812,006

[22] Filed: Mar. 5, 1997

[51] Int. Cl.⁶ .................................................. C23C 16/00
[52] U.S. Cl. ...................... 427/248.1; 118/715; 156/345
[58] Field of Search ........................ 118/715; 427/248.1; 156/345

[56] References Cited

U.S. PATENT DOCUMENTS

| | | | |
|---|---|---|---|
| 4,018,580 | 4/1977 | Bürkholz et al. | 55/321 |
| 4,392,452 | 7/1983 | Taketoshi et al. | 118/725 |
| 4,412,859 | 11/1983 | Hatfield et al. | 75/83 |
| 4,488,887 | 12/1984 | Angel et al. | 55/269 |
| 4,608,063 | 8/1986 | Kurokawa | 118/728 |
| 5,027,642 | 7/1991 | Wen et al. | 73/23.2 |
| 5,131,931 | 7/1992 | Miley et al. | 55/97 |
| 5,199,267 | 4/1993 | Mitsui | 62/51.1 |
| 5,242,468 | 9/1993 | Clark et al. | 29/25.01 |
| 5,376,163 | 12/1994 | Carlson et al. | 95/22 |
| 5,437,710 | 8/1995 | Grant et al. | 95/12 |

FOREIGN PATENT DOCUMENTS 58-158392
(A)  9/1983  Japan ............................... F04C 25/02

*Primary Examiner*—Richard Bueker
*Attorney, Agent, or Firm*—Townsend, Townsend & Crew

[57] ABSTRACT

The present invention provides an apparatus and methods for controlling gas pressure within a semiconductor process chamber. The apparatus comprises a fluid conduit, and a throttle valve positioned downstream of the process chamber outlet for controlling gas flow therethrough. A filter is disposed between the inlet of the fluid conduit and the throttle valve for collecting gas particles flowing through the fluid conduit to inhibit gas deposition on the throttle valve. In addition, the filter functions as a flow restrictor to reduce the gas flow rate through the fluid conduit. This allows the throttle valve to operate in a more open position for a particular desired gas pressure, which usually reduces the amount of throttle valve surfaces exposed to gas passing therethrough. Accordingly, the amount of gas deposited on these surfaces is further reduced. This configuration minimizes any friction between valve surfaces, which increases the lifetime of the throttle valve and the throughput of the process.

20 Claims, 4 Drawing Sheets

APPARATUS AND METHOD FOR CONTROLLING PROCESS CHAMBER PRESSURE

BACKGROUND OF THE INVENTION

The present invention generally relates to the fabrication of integrated circuits. More particularly, the invention provides an improved throttle valve and improved apparatus and methods for controlling pressure within a processing chamber.

High density integrated circuits, commonly termed VLSI devices, are typically formed on semiconductor wafers by subjecting the wafers to a number of deposition, masking, doping and/or etching processes. The wafers are placed onto a pedestal or susceptor within a process chamber and process gas(es) are delivered into the chamber onto the wafer to perform the various deposition and etching steps. For example, one typical process involves delivering $SiH_4$ and $N_2$ into the process chamber while applying RF energy to form a plasma for depositing silicon nitride on the wafer. During each step, once the appropriate layers have been deposited and/or removed from the wafer, the remaining plasma and gas residue are withdrawn from the process chamber by a suitable vacuum source, such as a pump.

An important consideration in semiconductor processing is the gas pressure within the process chamber. For example, the gas pressure within the process chamber typically affects the characteristics of the layers deposited on the wafer and/or the geometry of the portions etched from the wafer. Small changes in the chamber pressure during processing may lead to non-uniform deposition or etching on the wafer, which is typically undesirable.

The gas pressure within a semiconductor process chamber is usually controlled by a throttle valve disposed along a discharge line between the gas outlet of the process chamber and the pump. The throttle valve is coupled to a pressure sensor, such as a manometer, and an external controller that causes the throttle valve to open and close to regulate the pressure within the chamber. Existing throttle valves usually include a valve body with a through-hole in communication with the discharge line and a rotatable member, such as a valve plug or disc, rotatably disposed within the valve body. The valve plug or disc is rotated within the valve body by a suitable drive motor to vary the cross-sectional area of the through-hole, thereby regulating the gas flow through the throttle valve to control the pressure within the process chamber.

During certain processes, such as high pressure process steps, the throttle valve is substantially closed so that a low gas flow-rate is established through the valve. In this substantially closed position, a surface of the plug or disc blocks a portion of the through-hole and, therefore, is typically exposed to the process gases that are discharged from the chamber along the discharge line. These gas particles bombard the exposed surface of the plug or disc and may adhere and solidify on the plug or disc surface, thereby forming a thin deposition layer on this surface.

Gas deposition on the exposed surface of a valve plug or disc may cause problems with the operation of the throttle valve. The valve plug, for example, typically contacts sealing surfaces on the valve body in a substantially frictionless manner as it rotates within the valve body. The sealing surfaces prevent process gases from leaking between the valve body and the plug. However, the gas deposition build-up on the plug surface increases the friction between the plug and the valve body sealing surfaces. This increased friction applies a larger load on the drive motor and may stretch the drive belt that couples the plug shaft with the motor, eventually causing the belt to break. This reduction in the lifetime of the belt increases the downtime of the apparatus, and therefore decreases the throughput of the manufacturing process.

In addition, the valve plug motor is typically configured to rotate in small steps, with each of these steps corresponding to a distinct chamber pressure. This step configuration is considered desirable because it allows the operator to control the chamber pressure by rotating the valve plug a specific number of steps corresponding to the pressure desired. Increased friction between the plug and the valve body may cause the motor to skip steps, thereby disturbing the one-to-one correspondence between the motor steps and chamber pressure intervals. When this occurs, the motor steps will not correspond to their associated pressure settings, which could cause the operator to set an inaccurate chamber pressure during processing.

SUMMARY OF THE INVENTION

The present invention provides apparatus and methods for controlling gas pressure within a semiconductor process chamber, such as a vapor deposition chamber having a throttle valve for controlling the gas pressure within the chamber. These methods and apparatus are designed to inhibit gas deposition on exposed surfaces of the throttle valve, which minimizes friction between moving parts of the throttle valve. This improves operation of the throttle valve motor and increases the lifetime of the valve, which increases the throughput of the process.

The apparatus of the present invention includes a fluid conduit, a throttle valve disposed along the fluid conduit for controlling a gas flow rate therethrough, and a filter disposed between the inlet of the fluid conduit and the throttle valve. The filter collects particulate matter, such as solidified gas particles, flowing through the fluid conduit to inhibit gas deposition on the throttle valve. In addition, the filter functions as a flow restrictor to reduce the gas flow rate through the fluid conduit. This allows the throttle valve to operate in a more open position for a particular desired gas pressure in the process chamber. A more open throttle valve typically reduces the throttle valve surface area that is exposed to process gas bombardment which, in turn, further reduces the amount of gas deposition on these valve surfaces.

In a specific configuration, the filter comprises a plate or disc having a plurality of openings sized to collect solidified gas particles passing therethrough. The openings are also preferably sized to restrict the gas flow therethrough so that the throttle valve may be operated at a more open position for a desired gas pressure. The filter is removably coupled to the fluid conduit between the throttle valve and the process chamber outlet. In this manner, the filter can be easily and quickly replaced when the collected gas particles begin to clog the openings of the filter. In a preferred embodiment, the filter comprises a thin plate mounted between upper and lower fluid conduit portions by a flange assembly. The flange assembly will include an annular sealing member to maintain gas-tight integrity within the fluid conduit.

The throttle valve preferably includes a valve body defining a through-hole and a rotatable plug or disc for varying the cross-sectional area of the through-hole to adjust the gas flow rate therethrough. The rotatable plug or disc will usually define one or more surfaces that are exposed to the incoming gas stream. These exposed surface may become deposition sites for gas particles flowing therethrough. Minimizing gas deposited onto the exposed surface of the valve plug during operation of the throttle valve minimizes friction between the plug and the valve body during operation of the throttle valve. For example, in an exemplary embodiment, the valve plug is rotated within the valve body by a drive motor. Maintaining a relatively smooth, low-friction engagement between the valve body and the plug reduces the load on the motor and minimizes wear on the drive belt coupling the motor to the plug. This leads to a longer drive belt lifetime which, in turn, reduces the downtime of the apparatus, thereby increasing the throughput of the manufacturing process. In addition, a smoother engagement between the valve body and the plug will help prevent the motor from skipping steps, thereby ensuring more accurate control of the processing chamber pressure.

In an exemplary configuration, the invention comprises an enclosure housing a processing chamber and having gas inlet(s) and outlet(s) for delivering gas through the processing chamber. The throttle valve is coupled to the chamber outlet along a gas discharge line for controlling the gas pressure within the process chamber. The gas pressure within the chamber is monitored with a manometer, and controlled by varying the flow cross-sectional area of the throttle valve. Usually, a processor receives from the manometer signals that indicate the chamber pressure. The processor will compare the measured pressure value with set point pressure values entered by operators (not shown), and determine the necessary adjustment of the throttle valve that is required to maintain the desired pressure within the chamber. According to the present invention, a filter/flow restrictor is positioned along the discharge line between the chamber outlet and the throttle valve. The filter/flow restrictor collects solidified gas particles and reduces the gas flow rate through the discharge line. Thus, the throttle valve may be set at a more open position for a particular set point pressure value so that the moving surfaces of the throttle valve have less exposure to the gas particles flowing therethrough.

The present invention achieves these improvements in the context of known process technology; however, further understanding of the nature and advantage of the present invention may be realized by reference to the specification and attached drawings.

DESCRIPTION OF THE PREFERRED EMBODIMENTS

Figure 1:
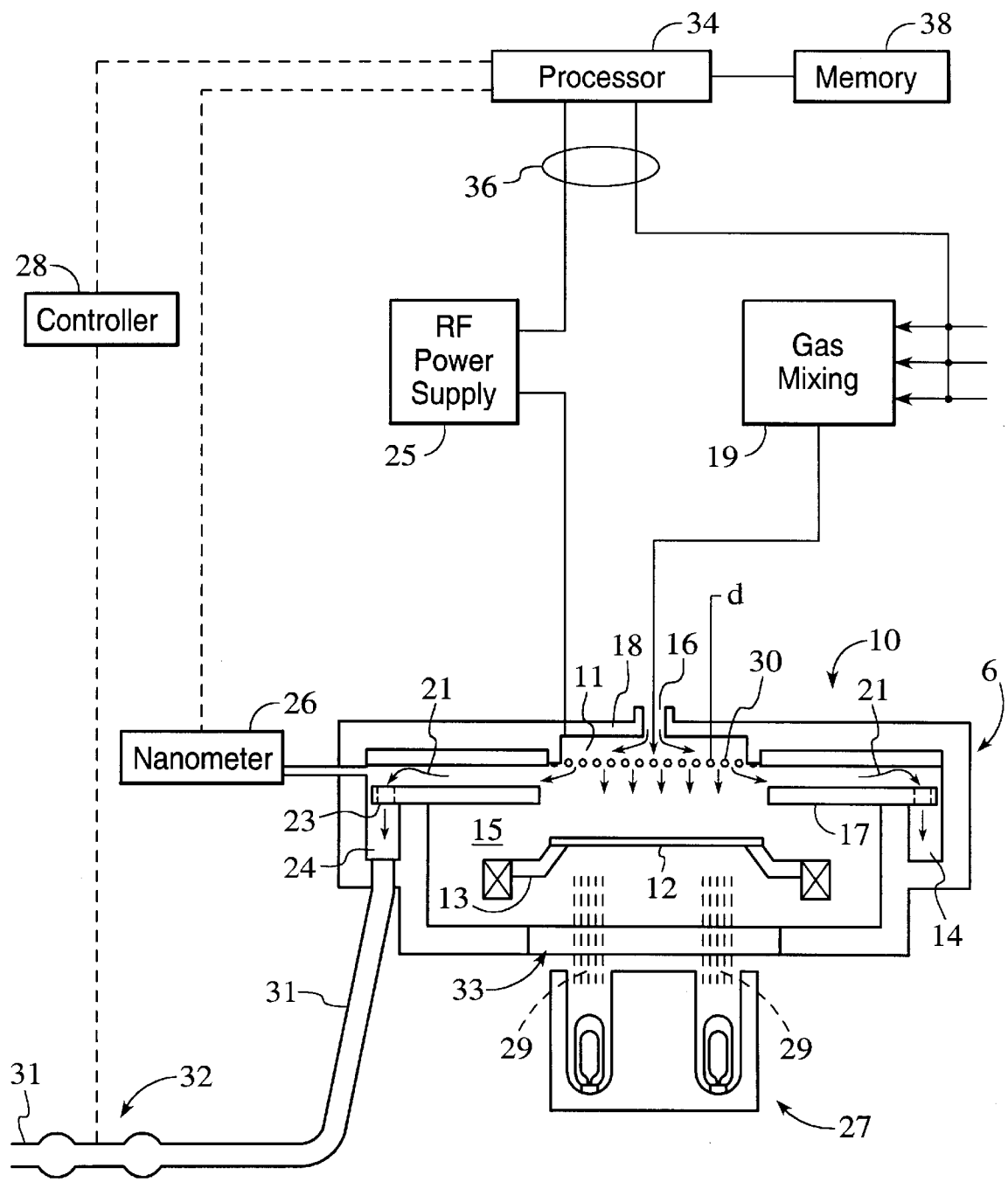
FIG. 1 schematically depicts a representative semiconductor processing apparatus.

Referring to FIG. 1, a representative vapor deposition apparatus 10 capable of CVD processing incorporates a throttle valve 32 fabricated in accordance with the principles of the present invention. Vapor deposition apparatus 10 generally includes an enclosure assembly 6 having a vertically movable wafer support pedestal or susceptor 12 beneath a showerhead 30 through which process gases enter a vacuum chamber 15. A pumping plate 17 extends around susceptor 12 for discharging the process gases and other plasma residue from chamber 15 into a pumping channel 14 partially circumscribing chamber 15.

Vapor deposition apparatus 10 is preferably attached to a mainframe unit (not shown) which provides electrical, plumbing and other support functions for the apparatus 10. Mainframe units that are compatible with the illustrative embodiment of vapor deposition apparatus 10 are currently commercially available as the Precision 5000™ and the Centura 5200™ systems from Applied Materials, Inc. of Santa Clara. It should be understood, however, that although the invention is shown and described as part of a vapor deposition chamber in a multi chamber processing system, it is not intended to be limited in this manner. That is, the invention can be used in a variety of processing chambers, such as etch chambers, diffusion chambers or the like.

Enclosure assembly 6 is preferably an integral housing made from a process compatible material, such as aluminum or anodized aluminum, or a ceramic material, such as aluminum nitride or aluminum oxide. Assembly 6 includes an upper lid 18 and an inlet tube 16 for allowing reactive and carrier gases to enter showerhead 30, where they are uniformly dispersed throughout chamber 15 onto a wafer (not shown) supported on susceptor 12. A motor (not shown) raises and lowers susceptor 12 between a processing position and a lower, substrate-loading position. Motors and optical sensors are used to move and determine the position of movable mechanical assemblies such as throttle valve 32 and susceptor 12. The deposition process performed in apparatus 10 can be a thermal process, a plasma enhanced process or other suitable process. In a plasma process, a controlled plasma is formed adjacent to the wafer by RF energy applied to showerhead 30 from an RF power supply 25. RF power supply 25 can supply either single or mixed frequency RF power to showerhead 30 to enhance the decomposition of reactive species introduced into process chamber 15. Purging gas may be delivered into chamber 15 from an inlet port or tube (not shown) through the bottom wall of enclosure assembly 6.

RF power supply 25 is controlled by a processor 34, which operates under the control of a computer program stored in a memory 38. Processor 28 controls all of the activities of the CVD machine. The system controller executes system control software, which is a computer program stored in a computer-readable medium such as a memory 38. Preferably, memory 38 may be a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Of course, other computer programs such as one stored on another memory device including, for example, a floppy disk or other another appropriate drive, may also be used to operate processor 34. A more complete description of exemplary system control software for apparatus can be found in commonly assigned, co-pending application Ser. No. 08/748,883, filed Nov. 13, 1996, titled "SYSTEMS AND METHODS FOR HIGH TEMPERATURE PROCESSING OF SEMICONDUCTOR WAFERS" (attorney docket AM1680/T15900), the complete disclosure of which is incorporated herein by reference.

A pump (not shown) disposed exterior to apparatus 10 provides vacuum pressure within pumping channel 14 to draw both the process and purge gases out of chamber 15 and through the pumping channel 14, where they are discharged from apparatus 10 along a discharge conduit 31. The flow rate of the gases through pumping channel 14 and discharge conduit 31 is preferably controlled by throttle valve 32 which is suitably disposed along conduit 31. The pressure within processing chamber 15 is monitored with a manometer 26 and controlled by varying the flow cross-sectional area of conduit 31 with throttle valve 32 (discussed in further detail below). Preferably, processor 34 receives from manometer 16 signals that indicate the chamber pressure. Processor 34 will compare the measured pressure value with set point pressure values entered by operators (not shown), and determine the necessary adjustment of throttle valve 32 that is required to maintain the desired pressure within chamber 15. The processor 34 relays an adjustment signal through a controller 28 to a drive motor (not shown), which adjusts throttle valve 32 to a proper setting corresponding to the set point pressure value.

Heat is distributed by an external lamp module 27. External lamp heater module 27 provides a collimated annular pattern of light 29 through a quartz window 31 onto an annular outer peripheral portion of susceptor 12. Such heat distribution compensates for the natural heat loss pattern of the susceptor and provides rapid thermal and uniform susceptor and substrate heating for effecting deposition. Alternatively, vapor deposition apparatus 10 may include a resistively heated support platen (not shown) for heating the wafer within chamber 15. A description of a suitable resistively heated susceptor can be found in patent application "SYSTEMS AND METHODS FOR HIGH TEMPERATURE PROCESSING OF SEMICONDUCTOR WAFERS" (attorney docket AM1680/T15900), the complete disclosure of which has previously been incorporated herein by reference.

Typically, any or all of the chamber lining, showerhead, support fingers, and various other reactor hardware is made out of material such as aluminum or anodized aluminum, or a ceramic material, such as aluminum oxide or aluminum nitride. An example of such a CVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," issued to Chang et al. and assigned to Applied Materials, Inc., the assignee of the present invention, and is incorporated herein by reference for all purposes.

The above description is mainly for illustrative purposes and should not be considered as limiting the scope of the present invention. Variations of the above described apparatus such as variations in susceptor design, heater design, location of RF power connections and others are possible.

Figure 2:
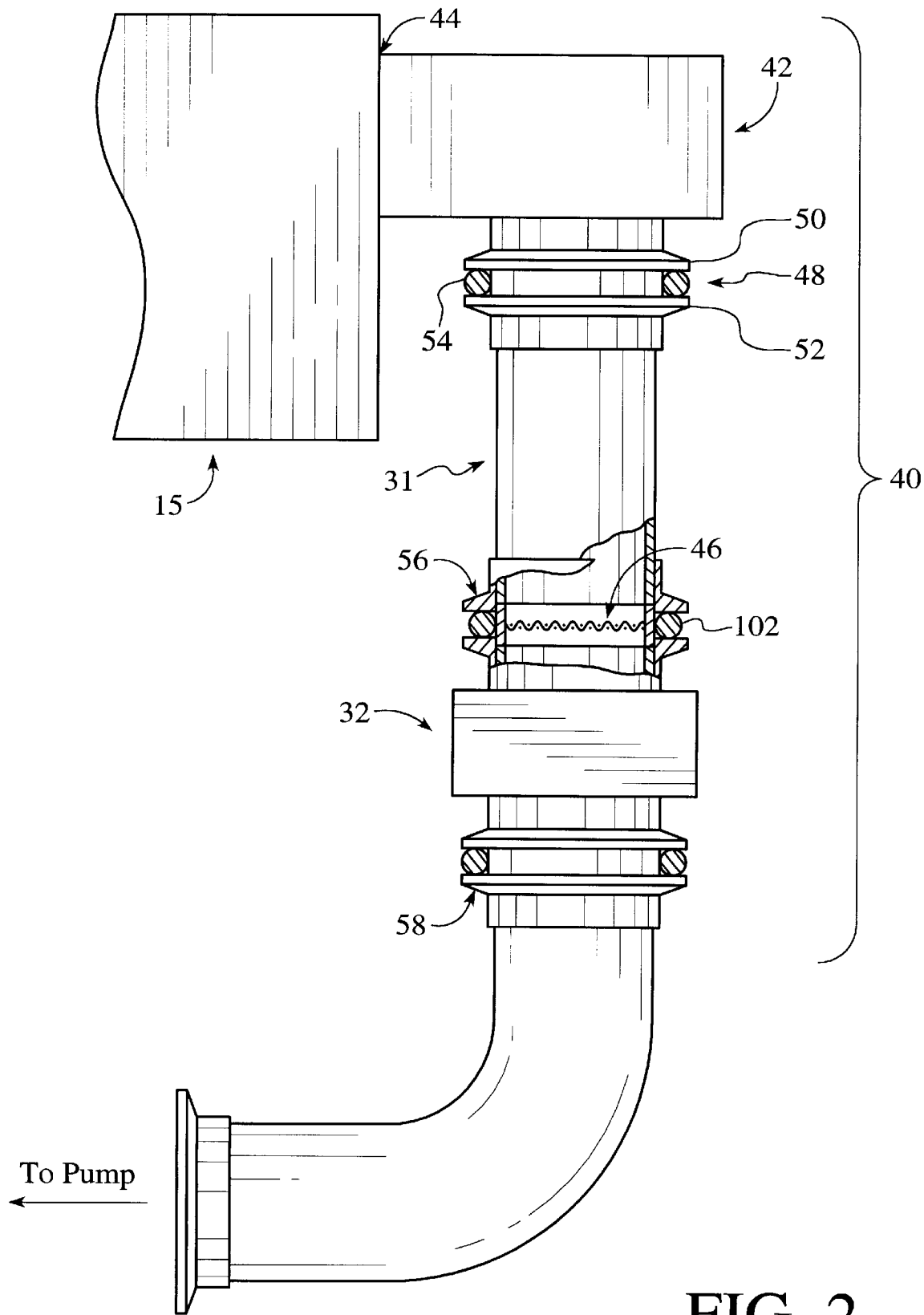
FIG. 2 is an enlarged sectional view of a portion of the semiconductor processing apparatus of FIG. 1 illustrating a throttle valve and a flow restrictor/filter according to the present invention.

Referring to FIG. 2, a valve assembly 40 according to the present invention includes throttle valve 32, a flow restrictor/filter 46 and an optional isolation valve 42 disposed along discharge line 31 between throttle valve 32 and a gas outlet 44 of process chamber 15. Isolation valve 42 is coupled to discharge line 31 and secured in position adjacent outlet 44. Preferably, discharge line 31 is made of a number of pipe sections that are coupled to each other on either side of the valves with flange assemblies. Specifically, valve 42 is secured to discharge line 31 with a flange assembly 48 having upper and lower flanges 50, 52 connected to an annular sealing member 54, such as an O-ring. Throttle valve 32 is coupled to discharge line 31 by a pair of similar flange assemblies 56, 58 on either side of valve 32. Flow restrictor/filter 46 is preferably incorporated into the upper flange assembly 56, as discussed in further detail below. Of course, it will be readily recognized by those skilled in the art that valves 32, 42 and filter 46 may be mounted to line 31 by a variety of conventional mounting devices other than flanges.

Isolation valve 42 may be used to isolate process chamber 15 from the pump to minimize the reduction of chamber pressure due to the pumping action of the pump. Isolation valve 42, together with throttle valve 32, may also be used to calibrate the mass flow controllers (not shown) of apparatus 2. In some processes, liquid or gas dopants are vaporized, and then delivered into process chamber 15 along with a carrier gas. The mass flow controllers (MFCs) are used to monitor the flow rate of the liquid or gas dopants into the chamber 15. During calibration of the MFCs, isolation valve 42 restricts or limits the gas flow to throttle valve 32 to maximize the pressure increase in chamber 15, which facilitates MFC calibration. A more complete description of a suitable isolation valve for use with the present invention can be found in commonly assigned, co-pending application Ser. No. 08/680,392, filed Jul. 15, 1996 (Attorney Docket No.: AM-1469/T-13000), the complete disclosure of which is incorporated herein by reference.

Figure 3:
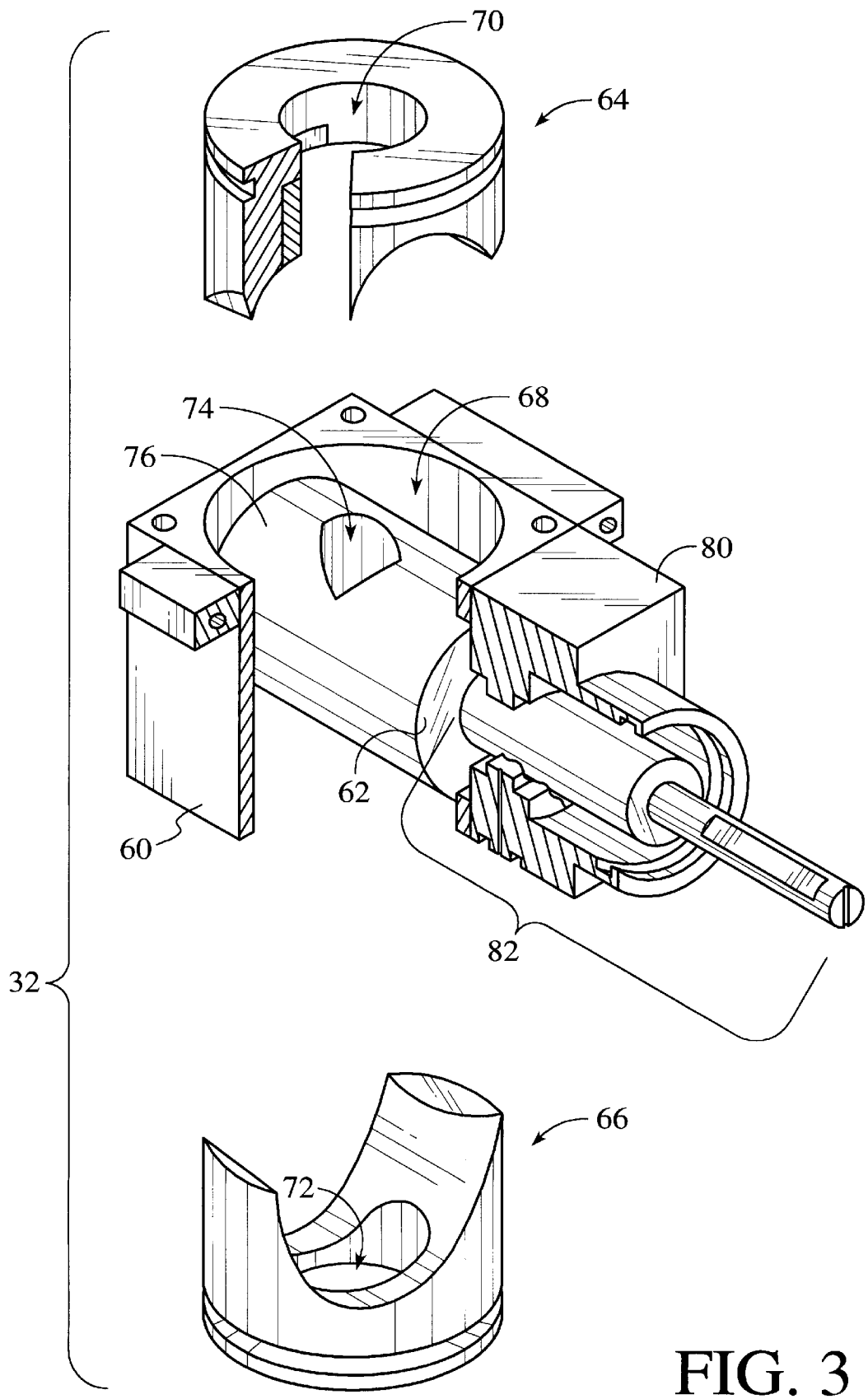
FIG. 3 is an exploded view of an exemplary throttle valve for use with the present invention.

FIG. 3 depicts an exemplary throttle valve 32 for use with the present invention. As shown, throttle valve 32 generally includes a valve body 60, and a valve plug 62 rotatably mounted between a pair of sealing members 64, 66 within body 60 for controlling gas flow through a through-hole 68. As mentioned previously, flanges 56, 58 (FIG. 2) are mounted to valve body 60 on either end of through-hole 68 for attaching throttle valve 32 to discharge conduit 31. Sealing members 64, 66 each have central openings 70, 72, respectively, fluidly coupled to an inner passage 74 within valve plug 62. Openings 70, 72 and passage 74 connect either end of through-hole 68 of valve body 60 for allowing gas flow therethrough. Rotation of valve plug 62 and passage 74 relative to openings 70, 72 varies the effective cross-sectional area of openings 70, 72 to thereby control the flow of gas through valve body 60. Valve plug 62 defines a surface 76 adjacent to passage 74 that is aligned with opening 70 and the upstream portion of discharge conduit 31 (see FIG. 1) in the closed or partially closed configurations of throttle valve 32. Exposed surface 76 is typically subjected to gaseous deposition during processing when the throttle valve is at least partially closed.

Valve body 60 is mounted to a housing 80 for coupling valve body 60 to the drive motor (not shown). The drive motor preferably comprises a reversible DC or AC motor, such as a stepper motor, that is suitably coupled to a drive shaft 82 for rotating valve plug 62 in small steps, with each of these steps corresponding to a distinct chamber pressure. This step configuration is considered desirable because it allows the operator to control the chamber pressure by rotating valve plug 62 a specific number of steps corresponding to the pressure desired. Preferably, the drive motor will be coupled to drive shaft 82 via a series of gears. However, drive belts or other suitable coupling mechanisms may be utilized for this purpose. A more complete description of throttle valve 32 can be found in commonly assigned, co-pending application Ser. No. 08/672,891, filed Jun. 28, 1996 (Attorney Docket No.: AM-891/T-2200), the complete disclosure of which is incorporated herein by reference.

Figure 4:
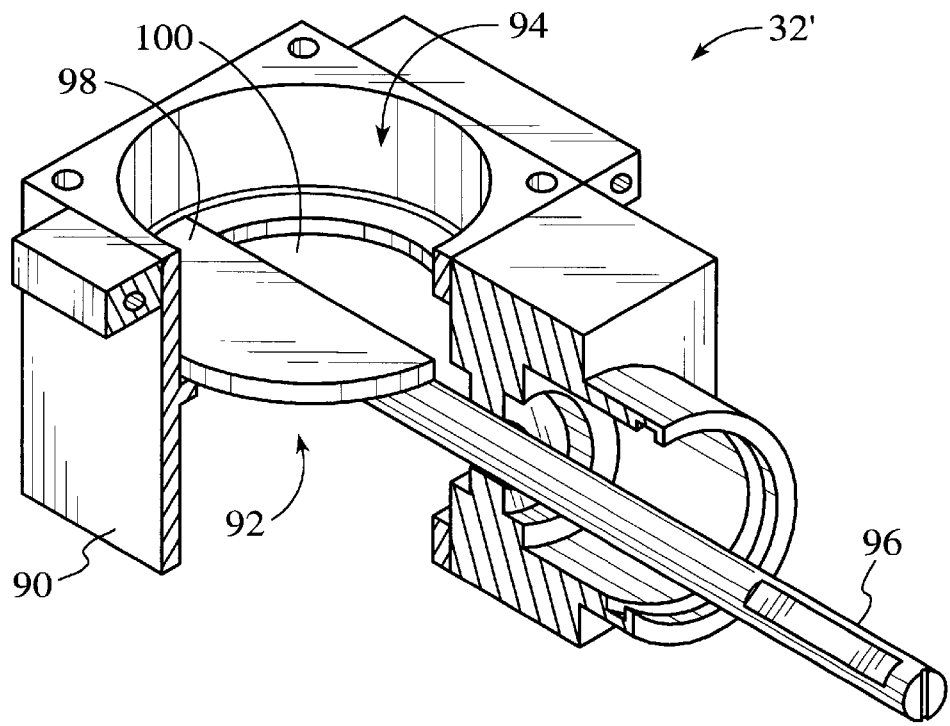
FIG. 4 is partial cut-a-way view of another exemplary throttle valve for use with the present invention.

FIG. 4 illustrates another exemplary throttle valve 32' for use with the present invention. Throttle valve 32' generally includes a valve body 90, and a disc assembly 92 rotatably disposed within a through-hole 94 of the valve body 90 for controlling gas flow therethrough. Rotation of disc assembly 92 within through-hole 94 of valve body 90 varies the effective cross-sectional area of through-hole 94 to thereby control the flow of gas through throttle valve 32'. Disc assembly 92 comprises a drive shaft 96 coupled to a pair of semi-circular valve discs 98, 100 that are offset from each other by coupling each disc 98, 100 to an opposite side of shaft 96. Drive shaft 96 is coupled to a suitable drive motor (not shown) for rotating discs 98, 100 within through-hole 94 to control gas flow therethrough. Discs 98, 100 will usually be capable of rotating at least 45°, and preferably at least 90°, about drive shaft 96. Discs 98, 100 rotate from a closed position, in which the discs 98, 100 allow substantially no gas flow through throttle valve 32', and a completely open position (not shown) in which the discs 98, 100 provide substantially no impedance to the gas flow. A more complete description of throttle valve 32' can be found in application Ser. No. 08/680,392, filed Jul. 15, 1996 (Attorney Docket No.: AM-1469/T-13000), the complete disclosure of which has previously been incorporated herein by reference.

Figure 5:
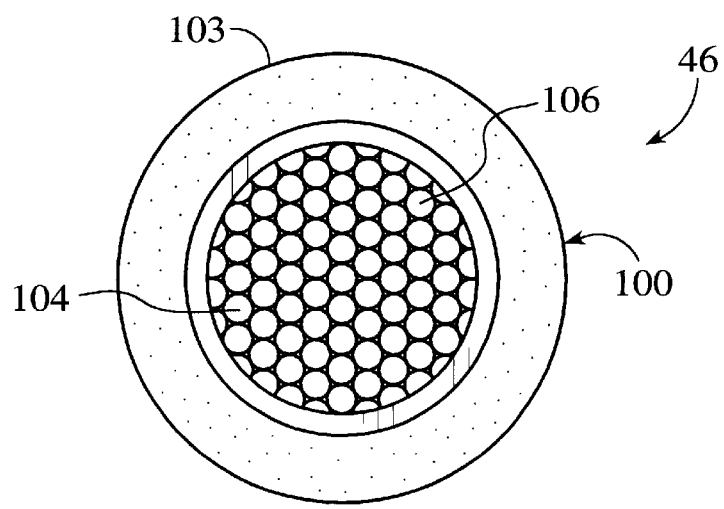
FIG. 5 is a top view of the filter/flow restrictor of FIG. 2.

Referring to FIGS. 2 and 5, a preferred embodiment of flow restrictor/filter 46 will now be described in detail. As shown, filter 46 comprises a plate or disc 100 preferably sized to fit within annular seal member 102 of flange assembly 56. As shown in FIG. 5, disc 100 comprises an outer ring 103 and a central filter section 104 having a plurality of openings 106 for allowing gas to flow therethrough. Filter section 104 collects solidified gas particles passing through conduit 31. Filter section 104 will usually comprise a material capable of withstanding high gas pressures. In addition, the material should be essentially unreactive towards the gases passing therethrough. Suitable materials include glass, metals, metal alloys and certain thermoplastic polymers. In the preferred configuration, filter 104 comprises a sintered stainless steel component suitably coupled (e.g., by welding, soldering or other suitable means) to the outer ring 103. Stainless steel is particularly preferred due to its relative inertness and fabrication properties.

Openings 106 are sized to inhibit or completely block the passage of particulate material, such as gas deposition products or the like. Thus, filter section 104 collects a substantial portion of the gas deposition products flowing through gas line 31 from the process chamber 15. Preferably, openings 106 are also sized to restrict the gas flow rate passing through filter 46. To that end, openings 106 will usually have a diameter of about 0.0005 inches to 0.003 inches, and preferably about 0.001 inches to 0.002 inches. In this way, filter 46 also functions as a choke point for reducing the velocity of the gas flowing therethrough. For a given desired gas pressure in chamber 15 (and a corresponding desired flow rate through line 31), throttle valve 32 can be set at a more open position because filter 46 restricts the flow to throttle valve 32. This reduces the amount of gas deposition on the exposed surfaces of valve 32. For example, valve plug 62 of throttle valve 32 (FIG. 3) can be positioned in a more open setting so that a small surface area of surface 76 is exposed to the incoming gas stream.

Filter 46 can be quickly and easily removed from discharge line 31 for replacement when openings 106 begin to clog from the accumulation of solidified gas particles. Preferably, flange assembly 58 is removably coupled to discharge line 31 so that it can be unfastened for removal of filter 46. Consequently, removing and replacing filter 46 requires less time, and is less expensive, than removing or replacing the entire throttle valve 32. Thus, filter 46 increases the lifetime of throttle valve 32 and increases the throughput of the process.

A method for controlling gas pressure within process chamber 15 will now be described with reference to FIGS. 1–5. During processing, gas is delivered into process chamber 15 to increase or ramp up the gas pressure to the desired pressure (typically between about 5 to 700 Torr). To that end, the rotatable valve plug or disc of throttle valve 32 will initially be rotated into a closed position (not shown) so that the amount of gas will increase in chamber 15, thereby increasing the pressure therein. Once the gas pressure reaches the desired level, the pressure within chamber 15 is monitored with manometer 26, and controlled by varying the flow cross-sectional area of conduit 31 with throttle valve 32 (see FIG. 1). As gas is delivered into chamber 15 for the deposition and/or etching steps, the throttle valve 32 is rotated to maintain or adjust to the desired pressure. Usually, processor 34 receives from manometer 16 signals that indicate the chamber pressure. Processor 34 will compare the measured pressure value with set point pressure values entered by operators (not shown), and determine the necessary adjustment of throttle valve 32 that is required to maintain the desired pressure within chamber 15. The processor 34 relays an adjustment signal through a controller 28 to a drive motor (not shown), which adjusts throttle valve 32 to a proper setting corresponding to the set point pressure value.

Since the gas flow through conduit 31 is choked or restricted at filter 46, throttle valve 32 can be set at a more open position for a particular set point pressure value than if filter 46 was not present. This reduces the amount of exposed surface area on the throttle valve to the gas stream, thereby reducing gas deposition on throttle valve 32. For example, as shown in FIG. 3, as valve plug 62 is rotated into a more open position, hole 74 becomes more aligned with openings 70, 72 in sealing members 64, 66, which minimizes exposure of surface 76 to the gas flowing therethrough. In addition, filter 46 collects a substantial portion of the solidified gas particles passing through conduit 31 before they reach throttle valve 32. This further reduces gas deposition on the exposed surface 76 of valve 32 thereby improving its performance and increasing its lifetime. When the openings 106 in filter 46 begin to clog from the gas particles, filter 46 is replaced by removing flange assembly 58, removing filter 46 and inserting a new filter 46. This replacement of filter 46 can be accomplished relatively quickly, which reduces the downtime of the apparatus and increases the overall throughput of the process.

While the above is a full description of the specific embodiments, various modifications, alternative constructions and equivalents may be used. For example, while the description above is in terms of a chemical vapor deposition chamber for a multi chamber processing system, it would be possible to implement the present invention with other plasma etching chambers, physical deposition chambers or the like. Therefore, the above description and illustrations should not be taken as limiting the scope of the present invention as defined by the appended claims.

It should be further noted that the invention is not limited to a single wafer chamber as described above and shown in the enclosed drawings. For example, the throttle valve of the present invention could be installed into a batch chamber that simultaneously processes a plurality of wafers. In addition, the invention would be suitable for use in a multi wafer chamber that sequentially performs individual processing steps on each of the wafers.

What is claimed is:

1. An apparatus for minimizing deposition in an exhaust line comprising:
    a fluid conduit having an inlet and an outlet;
    a throttle valve coupled to the fluid conduit between the inlet and outlet for controlling a gas flow rate therethrough; and a filter coupled to the fluid conduit between the inlet and the throttle valve, the filter being configured to collect particulate matter flowing through the fluid conduit and to reduce the gas flow rate through the fluid conduit for inhibiting gas deposition on the throttle valve.

2. The apparatus of claim 1 wherein the filter is configured to operate under gas flow rates of about 10.0 to 760.0 Torr.

3. The apparatus of claim 1 wherein the throttle valve comprises a valve body defining a through-hole aligned with the fluid conduit, and a valve plug rotatably coupled within the valve body for controlling the gas flow rate through the through-hole.

4. The apparatus of claim 1 wherein the filter is removably coupled to the fluid conduit.

5. The apparatus of claim 1 wherein the filter is a plate defining a plurality of openings for allowing gas flow therethrough, the openings being sized to inhibit solidified gas particles from passing through the plate.

6. The apparatus of claim 6 further comprising a flange assembly for removably mounting the plate to the fluid conduit.

7. The apparatus of claim 6 wherein the openings are sized to restrict the gas flow rate through the fluid conduit.

8. The apparatus of claim 6 wherein the openings have a diameter of about 0.001 inches to 0.002 inches.

9. An apparatus for fabricating an integrated circuit device comprising:

an enclosure housing a processing chamber, the enclosure defining a gas inlet in communication with the processing chamber for receiving processing gas and a gas outlet for discharging the processing gas;

a pump for drawing gas from the processing chamber through the gas outlet;

a throttle valve coupled between the gas outlet and the pump for controlling a gas pressure within the processing chamber; and a filter coupled between the gas outlet and the throttle valve for collecting particulate matter flowing through the fluid conduit and for inhibiting gas deposition at the throttle valve.

10. The apparatus of claim 9 wherein the gas pressure within the processing chamber is about 10.0 to 760.0 Torr.

11. The apparatus of claim 9 wherein the filter is removably coupled to the fluid conduit.

12. The apparatus of claim 9 wherein the throttle valve comprises a valve body defining a through-hole aligned with the fluid conduit, and a valve plug rotatably coupled within the valve body for controlling the gas flow rate through the through-hole.

13. The apparatus of claim 12 wherein the valve plug is movable between open and closed positions to vary the gas flow rate through the fluid conduit, and wherein the filter reduces the gas flow rate through the fluid conduit such that the valve plug is positioned closer to the open position for a desired gas pressure within the process chamber.

14. The apparatus of claim 9 wherein the filter is a plate having a plurality of openings for allowing gas flow therethrough, the openings being sized to inhibit solidified gas particles from passing through the filter.

15. A method of fabricating an integrated circuit device comprising:

introducing a supply of gas into a process chamber through a gas inlet onto a semiconductor wafer;

discharging said gas through a gas outlet of the process chamber along an exhaust conduit;

controlling a gas flow rate through the exhaust conduit with a throttle valve to control a gas pressure within the process chamber; and filtering solidified gas particles from the gas flowing through said exhaust conduit before said gas reaches the throttle valve.

16. The method of claim 15 further comprising restricting a portion of the exhaust conduit between the gas outlet and the throttle valve to reduce the gas flow rate received by the throttle valve.

17. The method of claim 15 wherein the filtering step comprises collecting solidified gas particles in a filter disposed between the gas outlet and the throttle valve to inhibit gas deposition on exposed surfaces of the throttle valve.

18. The method of claim 15 wherein the gas pressure in the process chamber is about 10.0 to 706.0 Torr.

19. The method of claim 15 wherein the controlling step includes rotating a valve plug within a through-hole of the throttle valve to vary the cross-sectional area of the through-hole, the valve plug having one or more surfaces exposed to the gas flowing through the fluid conduit.

20. The method of claim 15 wherein the controlling step includes moving a rotatable assembly within a through-hole of the throttle valve to control a rate of gas flow along the fluid conduit.

* * * * *